(12) United States Patent
Lee et al.

(10) Patent No.: US 10,796,997 B2
(45) Date of Patent: Oct. 6, 2020

(54) SEMICONDUCTOR PACKAGE

(71) Applicant: SAMSUNG ELECTRONICS CO., LTD., Suwon-si (KR)

(72) Inventors: Jae Ean Lee, Suwon-si (KR); Han Na Jin, Suwon-si (KR); Tae Sung Jeong, Suwon-si (KR); Young Gwan Ko, Suwon-Si (KR); Jung Soo Byun, Suwon-Si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 16/205,164

(22) Filed: Nov. 29, 2018

(65) Prior Publication Data

US 2020/0066639 A1 Feb. 27, 2020

(30) Foreign Application Priority Data

Aug. 22, 2018 (KR) ........................ 10-2018-0097953

(51) Int. Cl.
*H01L 23/532* (2006.01)
*H01L 23/00* (2006.01)
*H01L 23/31* (2006.01)
*H01L 23/538* (2006.01)
*H01L 25/18* (2006.01)

(52) U.S. Cl.
CPC ...... *H01L 23/5329* (2013.01); *H01L 23/3128* (2013.01); *H01L 23/5383* (2013.01); *H01L 23/5386* (2013.01); *H01L 24/09* (2013.01); *H01L 24/17* (2013.01); *H01L 25/18* (2013.01); *H01L 2224/02373* (2013.01);

(Continued)

(58) Field of Classification Search
CPC . H01L 25/0657; H01L 24/97; H01L 25/0652; H01L 23/3128; H01L 21/561; H01L 21/563; H01L 21/4853; H01L 21/486
See application file for complete search history.

(56) References Cited

U.S. PATENT DOCUMENTS

| 10,128,193 B2 * | 11/2018 | Chen | ........................ H01L 24/19 |
| 2002/0056741 A1 * | 5/2002 | Shieh | ................... B23K 20/004 |
| | | | 228/180.5 |

(Continued)

FOREIGN PATENT DOCUMENTS

JP 2015-185575 A 10/2015
KR 10-2004-0051310 A 6/2004

*Primary Examiner* — Dung A. Le
(74) *Attorney, Agent, or Firm* — Sughrue Mion, PLLC

(57) ABSTRACT

A semiconductor package including an organic interposer includes: a semiconductor chip; a connection member on the semiconductor chip and including a pad layer, a redistribution layer, and an insulating layer; a bonding member between the semiconductor chip and the pad layer; a surface treatment layer on the pad layer and including at least one metal layer; and an under-bump metallurgy (UBM) layer embedded in the connection member. The UBM layer includes a UBM pad, at least one plating layer on the UBM pad, and a UBM via. The surface treatment layer is disposed only on one surface of the pad layer, the plating layer are is disposed only on one surface of the UBM pad, and at least a portion of a side surface of the plating layer is spaced apart from a side surface of the insulating layer surrounding the plating layer.

17 Claims, 14 Drawing Sheets

(52) U.S. Cl.
CPC .............. *H01L 2224/02379* (2013.01); *H01L 2224/0401* (2013.01); *H01L 2924/15311* (2013.01)

(56) References Cited

U.S. PATENT DOCUMENTS

| | | |
|---|---|---|
| 2004/0113244 A1 | 6/2004 | Shin et al. |
| 2014/0091473 A1* | 4/2014 | Len .................. H01L 24/05 257/774 |
| 2014/0252572 A1* | 9/2014 | Hou .................. H01L 24/97 257/666 |
| 2015/0271929 A1 | 9/2015 | Noda et al. |
| 2016/0358889 A1* | 12/2016 | Lai .................. H01L 23/481 |
| 2019/0164860 A1* | 5/2019 | Lin .................. H01L 21/565 |

\* cited by examiner

SEMICONDUCTOR PACKAGE

CROSS-REFERENCE TO RELATED APPLICATION(S)

This application claims benefit of priority to Korean Patent Application No. 10-2018-0097953 filed on Aug. 22, 2018 in the Korean Intellectual Property Office, the disclosure of which is incorporated herein by reference in its entirety.

TECHNICAL FIELD

The present disclosure relates to a semiconductor package including an organic interposer.

BACKGROUND

The interposer market is growing, with the adoption of high-end sets and high bandwidth memory (HBM). At present, silicon has been used as a main material in interposers, but glass and organic methods are being developed for large-scale and low-cost manufacturing. A connection portion of the interposer to a main board of the set is known as an under-bump metallurgy (UBM) layer, and the reliability of the connected portion is greatly influenced by a structure of such an UBM layer, and therefore there is a need to optimize the structure of such an UMB layer.

In particular, various surface treatments have been performed on such an UBM layer to improve bonding reliability. Such a surface treatment mainly uses electroless plating. In this case, a surface treatment layer is disposed on a side surface of a pad as well as on an upper surface of the pad, and therefore, various defects may occur after the UBM layer is bonded to a solder.

SUMMARY

An aspect of the present disclosure may provide a semiconductor package including an organic interposer capable of simplifying a process and preventing an occurrence of defects in a surface treatment layer and an UBM layer.

One of the solutions proposed by the present disclosure may form both a surface treatment layer and a plating layer of an UBM layer only on one surface of a pad at upper and lower portions of a connection member by electrolytic plating, and the plating layer of the UBM layer may be formed using a reverse plating method.

According to an aspect of the present disclosure, a semiconductor package including an organic interposer may include: a semiconductor chip having an active surface on which a connection pad is disposed; a connection member disposed on the active surface of the semiconductor chip and including a pad layer disposed on an upper surface thereof, a redistribution layer electrically connected to the connection pad, and an insulating layer; a bonding member disposed between the connection pad of the semiconductor chip and the pad layer of the connection member to connect the semiconductor chip with the connection member; a surface treatment layer disposed on an upper surface of the pad layer of the connection member and including at least one metal layer; and an under-bump metallurgy (UBM) layer embedded in the connection member and electrically connected to the redistribution layer of the connection member. The UBM layer may include a UBM pad embedded in the insulating layer of the connection member, at least one plating layer disposed on the UBM pad, and a UBM via penetrating through at least a portion of the insulating layer of the connection member and electrically connecting the redistribution layer of the connection member with the UBM pad. The surface treatment layer may be disposed only on one surface of the pad layer facing the bonding member, the plating layer of the UBM layer may be disposed only on one surface the UBM pad opposing the UBM via, and at least a portion of a side surface of the plating layer of the UBM layer may be spaced apart from a side surface of the insulating layer of the connection member surrounding the plating layer of the UBM layer.

BRIEF DESCRIPTION OF DRAWINGS

The above and other aspects, features, and advantages of the present disclosure will be more clearly understood from the following detailed description taken in conjunction with the accompanying drawings, in which.

DETAILED DESCRIPTION

Hereinafter, exemplary embodiments of the present disclosure will now be described in detail with reference to the accompanying drawings.

Electronic Device

Figure 1:
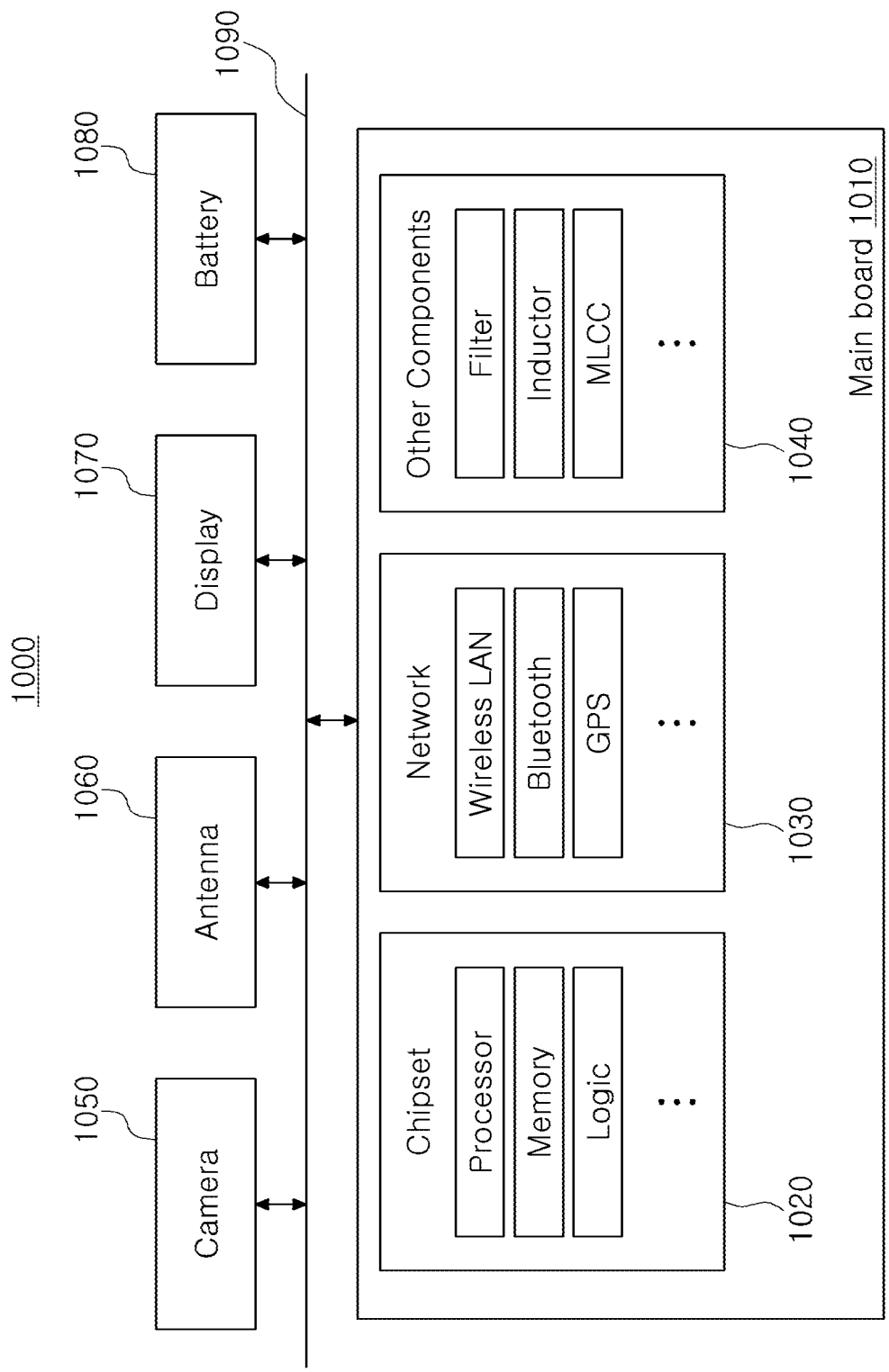
FIG. 1 is a block diagram schematically showing an example of an electronic device system.

FIG. 1 is a block diagram schematically showing an example of an electronic device system.

Referring to FIG. 1, an electronic device 1000 may accommodate a main board 1010. The main board 1010 is physically and/or electrically connected to a chip-related component 1020, a network-related component 1030, other components 1040 or the like. These components may be also coupled to other components to be described below to form various signal lines 1090.

The chip-related component 1020 may include memory chips such as a volatile memory (for example, DRAM), a non-volatile memory (for example, ROM), and flash memory, an application processor chip such as a central processor (for example, CPU), a graphics processor (for example, GPU), a digital signal processor, a cryptographic processor, a microprocessor, and a microcontroller, logic chips such as an analog-to-digital converter and an application-specific integrated circuit (ASIC), or the like but does not include only those components. Therefore, it goes without saying that other types of chip-related components may be included. Further, it goes without saying that the chip-related components 1020 may be combined with each other.

The network-related component 1030 may include WiFi (IEEE 802.11 family, or the like), WiMAX (IEEE 802.16 family, or the like), IEEE 802.20, long term evolution (LTE), Ev-DO, HSPA+, HSDPA+, HSUPA+, EDGE, GSM, GPS, GPRS, CDMA, TDMA, DECT, Bluetooth, 3G, 4G, and 5G, and any other wireless or wired standards or protocols specified as the next generation, but does not include only those components. Further, it goes without saying that the network-related component 1030 may be combined with the chip-related component 1020.

The other components 1040 may include a high frequency inductor, a ferrite inductor, a power inductor, ferrite beads, low temperature co-firing ceramics (LTCC), an electro magnetic interference (EMI) filter, and a multi-layer ceramic condenser (MLCC) or the like but does not include only those components. Therefore, the other components 1040 may include passive components or the like which are used for various other purposes. Further, it goes without saying that the other components 1040 may be combined with the chip-related component 1020 and/or the network-related component 1030.

Depending on the type of electronic device 1000, the electronic device 1000 may include other components that may or may not be physically and/or electrically connected to the main board 1010. Examples of the other components may include a camera 1050, an antenna 1060, a display 1070, a battery 1080, an audio codec (not shown), a video codec (not shown), a power amplifier (not shown), a compass (not shown), an accelerometer (not shown), a gyroscope (not shown), a speaker (not shown), a mass storage device (for example, hard disk drive) (not shown), a compact disk (CD) (not shown), a digital versatile disk (DVD) (not shown), or the like, but the other components do not include only those components. In addition, the other components may include other components or the like which are used for various other purposes according to the type of electronic device 1000.

The electronic device 1000 may be a smart phone, a personal digital assistant, a digital video camera, a digital still camera, a network system, a computer, a monitor, a tablet, a laptop, a netbook, a television, a video game, a smart watch, automotive or the like. However, the electronic device 1000 may not be limited thereto. In addition to those components, it goes without saying that the electronic device 1000 may be any other electronic devices for processing data.

Figure 2:
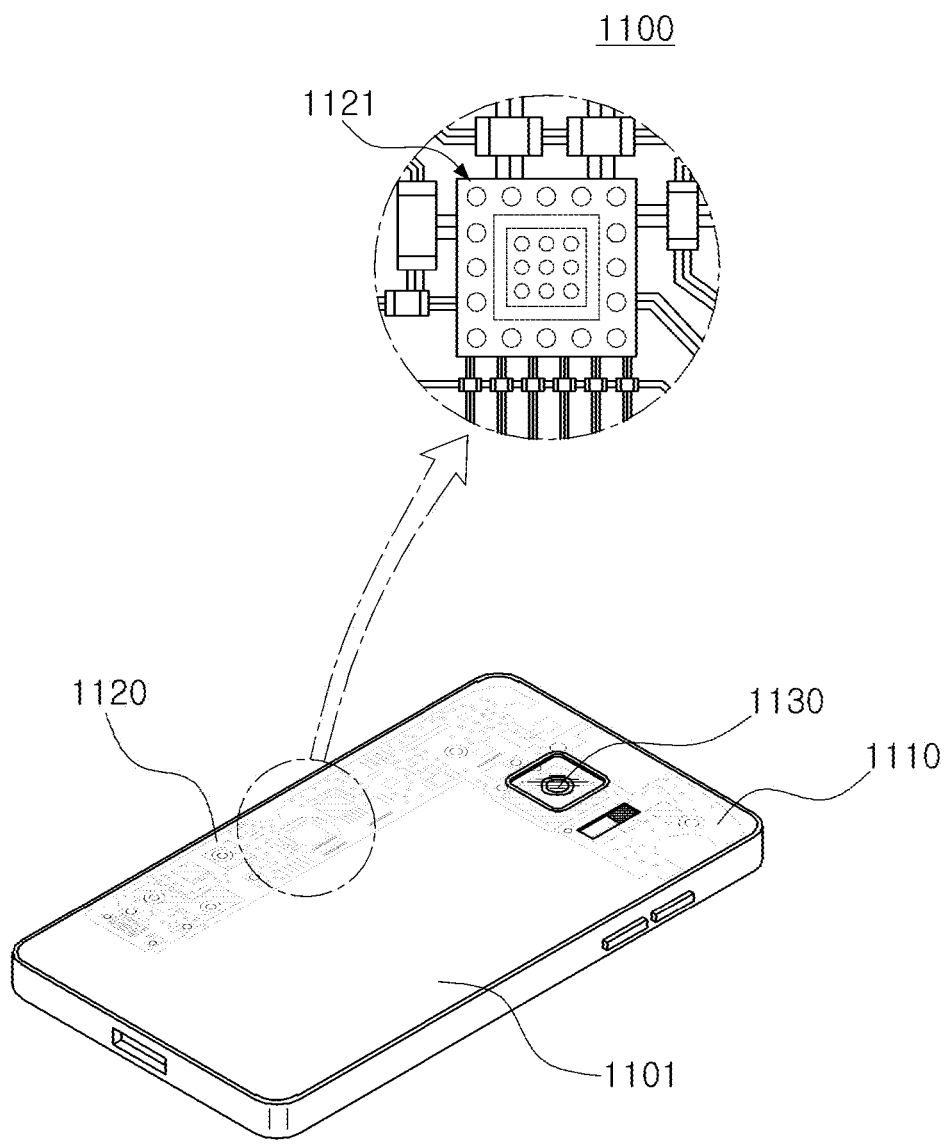
FIG. 2 is a perspective view schematically showing an example of an electronic device.

FIG. 2 is a perspective view schematically showing an example of an electronic device.

Referring to FIG. 2, a semiconductor package is applied to various electronic devices as described above for various purposes. For example, a mother board 1110 may be accommodated in a body 1101 of a smart phone 1100, and various components 1120 may be physically and/or electrically connected to the mother board 1110. Further, other components such as a camera 1130, which may or may not be physically and/or electrically connected to the mother board 1010, may be accommodated in the body 1101. Some of the components 1120 may be the chip-related component, and some of the components 1120 may be the interposer package 1121. It goes without saying that the electronic device is not limited to the smart phone 1100 but may be other electronic devices as described above.

Semiconductor Package Including Interposer

In general, scores of microelectronic circuits may be integrated in a semiconductor chip, but the semiconductor chip itself may not serve as a finished product of a semiconductor, and may be damaged by an external physical or chemical impact. Accordingly, the semiconductor chip itself may not be used as it is. For this reason, the semiconductor chip may be packaged and thus has been used for electronic devices or the like in the packaged state.

The reason why the semiconductor packaging is required is that there is a difference in a circuit width between the semiconductor chip and the main board of the electronic device in terms of an electrical connection. Specifically, in the case of the semiconductor chip, a size of connection pads and an interval between the connection pads are very small. On the other hand, in the case of the main board used for the electronic device, a size of component mounting pads and an interval between the component mounting pads may be much larger than a scale of the semiconductor chip. Therefore, a need exists for a packaging technology capable of buffering the difference in the circuit width between the semiconductor chip and the main board because it is difficult to directly mount the semiconductor chip on the main board.

Hereinafter, a semiconductor package including an organic interposer manufactured by such a packaging technique will be described in more detail with reference to the drawings.

Figure 3:
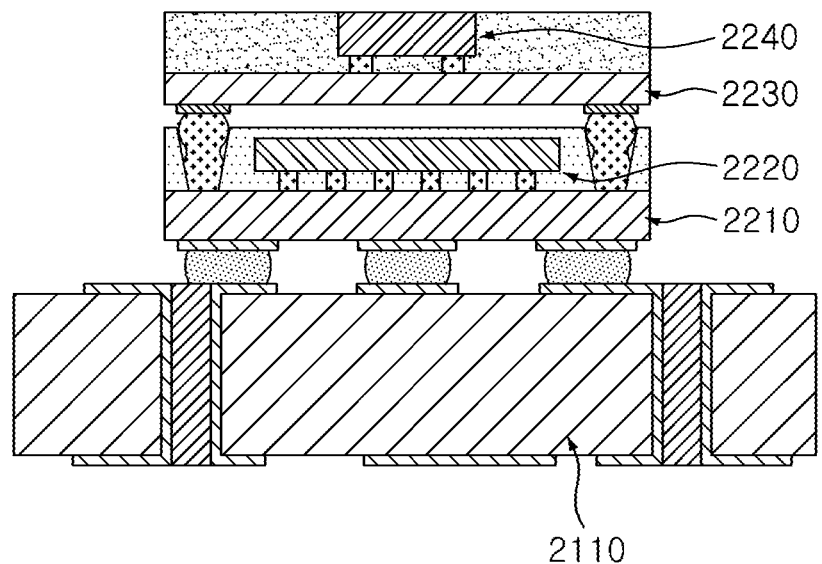
FIG. 3 is a cross-sectional view schematically showing a case where a 3D BGA package is mounted on a main board of the electronic device.

FIG. 3 is a cross-sectional view schematically showing a case where a 3D BGA package is mounted on a main board of the electronic device.

It is very important to carry out packaging at a high yield because each chip of an application specific integrated circuit (ASIC) such as a graphics processing unit (GPU) of the semiconductor chip is very expensive. For this purpose, a ball grid array (BGA) substrate 2210 or the like capable of redistributing thousands to hundreds of thousands of connection pads before the mounting of the semiconductor chip may be first prepared, and then an expensive semiconductor chip such as a GPU 2220 may be mounted on the BGA substrate 2210 by a surface mounting technology (SMT) or the like and packaged, and finally mounted on the main board 2110.

On the other hand, in the case of the GPU 2220, there is a need to greatly reduce a signal path to a memory such as a high bandwidth memory (HBM). To this end, the semiconductor chip such as an HBM 2240 may be mounted on the interposer 2230 and then packaged, and may be used by being stacked on the package on which the GPU 2220 is mounted in a package on package (POP) form. However, in this case, there may be a problem that the thickness of the apparatus becomes too thick, and it is difficult to greatly reduce the signal path.

Figure 4:
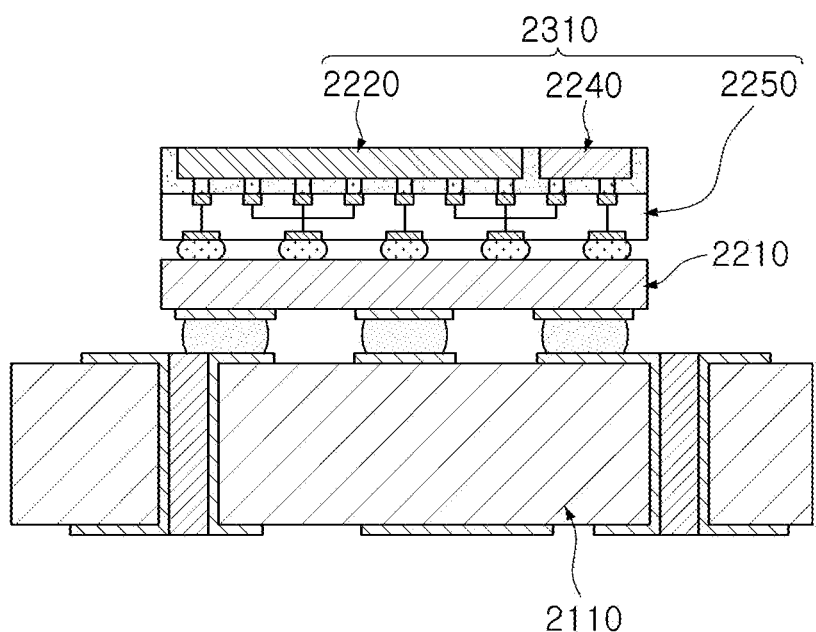
FIG. 4 is a cross-sectional view schematically showing a case where a 2.5D silicon interposer package is mounted on the main board.

FIG. 4 is a cross-sectional view schematically showing a case where a 2.5D silicon interposer package is mounted on the main board.

In order to solve the above-described problems, a semiconductor package 2310 including a silicon interposer may be manufactured by a 2.5D interposer technology of surface-mounting a first semiconductor chip such as a GPU 2220 and a second semiconductor chip such as an HBM 2240 on a silicon interposer 2250 side-by-side and packaging the first semiconductor chip and the second semiconductor chip. In this case, the GPU 2220 and the HBM 2240 having thousands to hundreds of thousands of connection pads can be redistributed through the interposer 2250, and can be electrically connected by a minimum path. If the semiconductor package 2310 including such a silicon interposer is mounted on the BGA substrate 2210 or the like again and distributed, the semiconductor package 2310 may finally be mounted on the main board 2110. However, in the case of the silicon interposer 2250, a through silicon via (TSV) is very difficult to form and manufacturing cost is also considerable, which is disadvantageous for large-scale and low-cost manufacturing.

Figure 5:
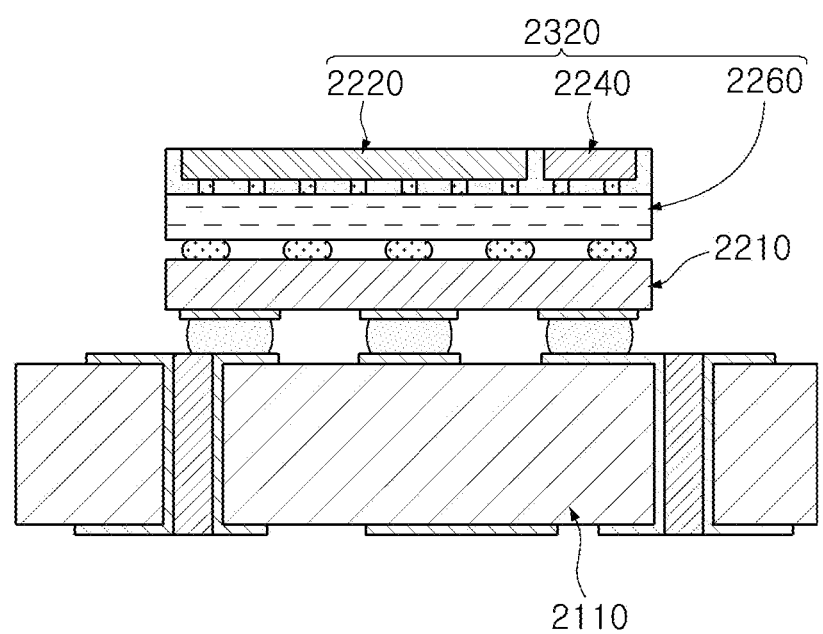
FIG. 5 is a cross-sectional view schematically showing a case where a 2.5D organic interposer package is mounted on the main board.

FIG. 5 is a cross-sectional view schematically showing a case where a 2.5D organic interposer package is mounted on the main board.

As a method for solving the above-mentioned problems, it may be considered to use an organic interposer 2260 instead of the silicon interposer 2250. For example, a semiconductor package 2320 including an organic interposer may be manufactured by a 2.5D interposer technology of surface-mounting a first semiconductor chip such as the GPU 2220 and a second semiconductor chip such as the HBM 2240 on an organic interposer 2260 side-by-side and packaging the first semiconductor chip and the second semiconductor chip. In this case, the GPU 2220 and the HBM 2240 having thousands to hundreds of thousands of connection pads can be redistributed through the interposer 2260, and can be electrically connected by a minimum path. If the semiconductor package 2320 including such an organic interposer is mounted on the BGA substrate 2210 or the like again and distributed, the semiconductor package 2310 may finally be mounted on the main board 2110. In addition, it is advantageous for large-scale and low-cost manufacturing.

Meanwhile, the semiconductor package 2320 including the organic interposer is manufactured by the package process of mounting the chips 2220 and 2240 on the interposer 2260, and then molding or sealing the chips 2220 and 2240. This is because if the molding process is not performed, the chips 2220 and 2240 on the interposer 2260 may not be handled and may not be connected to the BGA substrate 2210 or the like. Therefore, the rigidity of the chips 2220 and 2240 on the interposer 2260 is maintained by the molding. However, when the molding process is performed, as described above, problems such as occurrence of warpage, deterioration in underfill resin filling performance, and occurrence of cracks between a semiconductor chip and a sealing member may arise due to a mismatch of a coefficient of thermal expansion (CTE) between the interposer 2260 and a sealing member of the chips 2220 and 2240, or the like.

Figure 6:
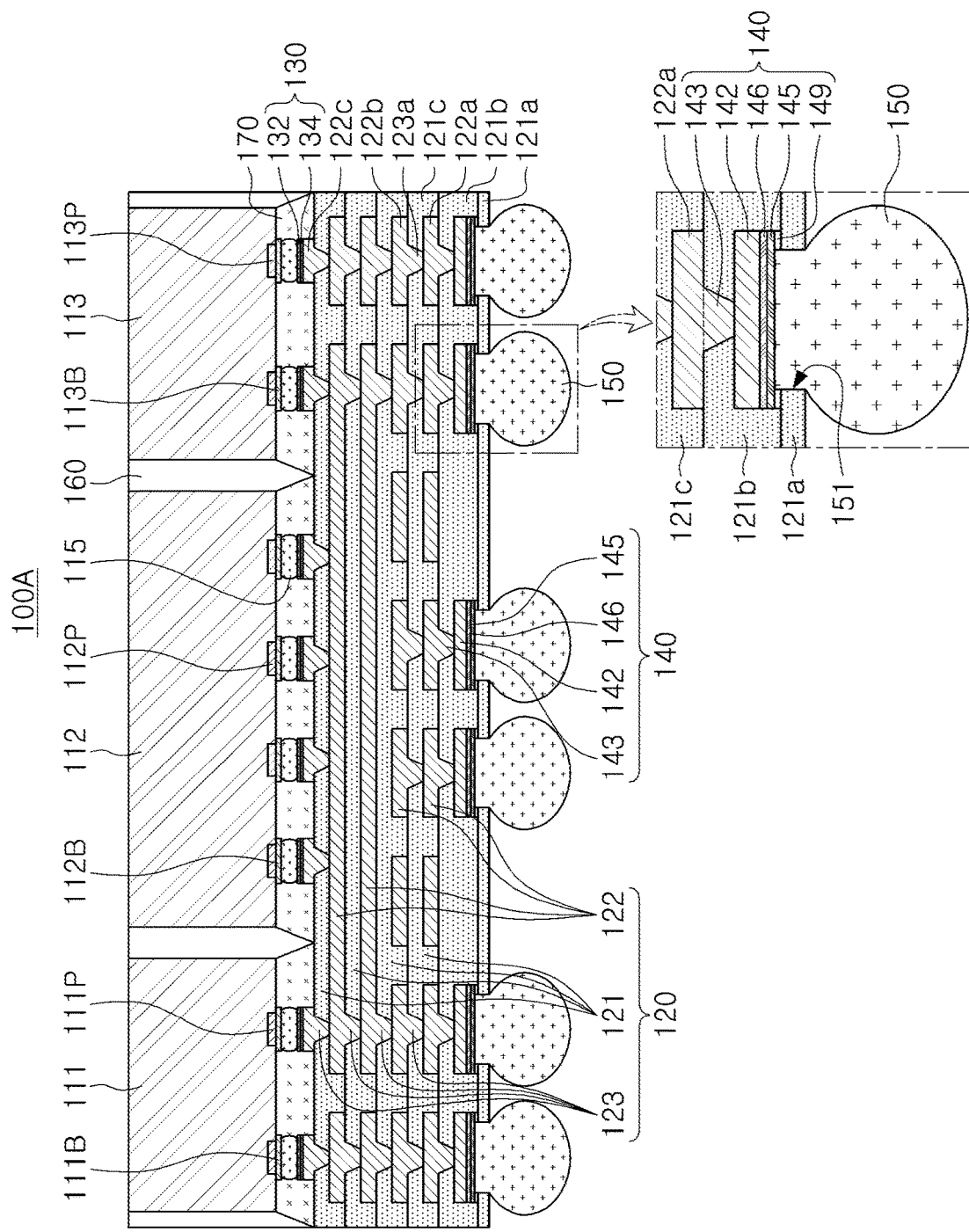
FIG. 6 is a cross-sectional view schematically showing an example of a semiconductor package including an organic interposer.

FIG. 6 is a cross-sectional view schematically showing an example of a semiconductor package including an organic interposer.

Referring to FIG. 6, a semiconductor package 100A including an organic interposer according to an example may include semiconductor chips 111, 112, and 113 each having active surfaces on which connection pads 111P, 112P, and 113P are disposed, a sealing member 160 sealing at least some portions of the semiconductor chips 111, 112, and 113, a connection member 120 disposed on the active surfaces of the semiconductor chips 111, 112, and 113 and including a redistribution layer 122 electrically connected to connection pads 111P, 112P, and 113P, respectively, a via 123 connected to the redistribution layer 122, and an insulating layer 121, a bonding member 115 disposed between the connection pads 111P, 112P, and 113P of the semiconductor chips 111, 112, and 113 and a pad layer 122c of the connection member 120 to bond the semiconductor chips 111, 112, and 113 to the connection member 120, a surface treatment layer 130 disposed on an upper surface of the pad layer 122c of the connection member 120, an UBM layer 140 embedded in the connection member 120 and electrically connected to the redistribution layer 122 of the connection member 120, and an electrical connection structure 150 connected to the UBM layer 140. The UBM layer 140 may include an UBM pad 142 embedded in the insulating layer 121 of the connection member 120, an UBM via 143 embedded in the insulating layer 121 of the connection member 120 to electrically connect the redistribution layer 122 of the connection member 120 with the UBM pad 142, and first and second plating layers 145 and 146 embedded in the insulating layer 121 of the connection member 120 and disposed on the UBM pad 142, and a metal layer 149 on the first and second plating layers 145 and 146.

The connection member 120 may be connected to the bonding member 115 and the electrical connection structure 150 at upper and lower portions thereof, respectively. The bonding member 115 may be connected by the uppermost pad layer 122c of the connection member 120, and the electrical connection structure 150 may be connected by the UBM layer 140 under the connection member 120. The surface treatment layer 130 may include first and second surface treatment layers 132 and 134 that may respectively include the same electrolytic metal layer as the first and second plating layers 145 and 146 of the UBM layer 140. That is, the surface treatment layer 130 and the first and second plating layers 145 and 146 may include the metal layers of the same material, and the structure in which the metal layers are stacked may be the same. For example, the first surface treatment layer 132 and the first plating layer 145 may be a gold (Au) plating layer, and the oxidation of the pad layer 122c and the UBM pad 142 may be prevented. A second surface treatment layer 134 and the second plating layer 146 may each be formed of a different material from the first surface treatment layer 132 and the first plating layer 145 and may be, for example, a nickel (Ni) plating layer. The second surface treatment layer 134 and the second plating layer 146 each may prevent an intermetallic compound from being formed due to the first surface treatment layer 132 and the pad layer 122c and the first plating layer 145 and the UBM pad 142. However, the surface treatment layer 130 and the first and second plating layers 145 and 146 may have different sizes or diameters on a plane. The surface treatment layer 130 is connected to the relatively small bonding member 115 and therefore may have a smaller diameter than the first and second plating layers 145 and 146.

All of the surface treatment layer 130 on the pad layer 122c and the first and second plating layers 145 and 146 of the UBM layer 140 are layers formed by the electrolytic plating. Therefore, unlike the existing structures of the electroless plating type, the surface treatment layer 130 and the first and second plating layers 145 and 146 do not extend onto side surfaces of the pad layer 122c and the UBM pad 142, but are disposed only on an upper surface of the pad layer 122c and a lower surface of the UBM pad 142. Therefore, defects such as Kirkendall void and consumption of a solder which are formed by wetting the bonding member 115 and the electrical connection structure 150 along the side surfaces of the pad layer 122c and the UBM pad 142 may be prevented from occurring.

Further, in the existing interposer, the package process of forming the redistribution layer on a carrier, attaching a die on the redistribution layer, and molding the same is performed and then the process of separating the package from the carrier, forming a via on a lower surface of the package contacting the carrier, performing exposure and plating, and the like is performed, thereby forming the UBM layer. Such a conventional method forms the UBM layer last, and is generally called a UBM layer last method. In the UBM layer last method, since the process is difficult to proceed due to the warpage problem in the package alone, there is a need to use a separate carrier and there is a burden to construct a dedicated line for the UBM layer process. In addition, there is a risk of process quality and yield reduction as products passing through a low-cleanliness package line have to undergo high-cleanliness exposure and plating processes again. Generally, when the UBM layer last method is applied, the UBM pad is formed on an insulating member or a passivation layer on the insulating member.

On the other hand, as will be described later, a semiconductor package 100A according to an example is manufactured by an UBM layer first method. That is, the UBM layer 140 may be formed first in the line forming the connection member 120 before the connection member 120 is formed. Therefore, the dedicated line for forming the UBM layer may be omitted, and the UBM layer may be formed at the panel level, so the process may be simplified. Particularly, since the first and second plating layers 145 and 146 corresponding to the surface treatment layer of the UBM pad 142 are formed first, the UBM layer 140 may be formed without design constraint due to a plating lead line, so a fine pitch may be implemented.

In the case of the semiconductor package 100A according to an example, a width of an upper surface of the UBM via 143 in contact with the redistribution layer 122 of the connection member 120 is larger than that of a bottom surface of the UBV via 143 in contact with the UBM pad 142. Here, the width is determined based on the cross-sectional view. When the UBM layer last method is applied as in the conventional method, the width of the upper surface of the UBM via is generally smaller than the width of the lower surface thereof. On the other hand, in the case of the semiconductor package 100A according to an example, the UBM layer first method is applied, and the UBM via 143 may be formed in a so-called inverted trapezoidal shape in which the width of the upper surface of the UBM via 143 is wider than that of the lower surface thereof. In addition, like the redistribution layer 122 and the via 123 of the connection member 120, the UBM pad 142 and the UBM via 143 may be formed and therefore the UBM via 143 may be a filled-via.

Hereinafter, each component in the semiconductor package 100A according to an example will be described in more detail.

The semiconductor chips 111, 112 and 113 may be, for example, processor chips such as a central processor (for example, a CPU), a graphics processor (for example, a GPU), a field programmable gate array (FPGA), a digital signal processor, a cryptographic processor, a microprocessor, and a microcontroller, logic chips such an analog-to-digital converter and an application-specific integrated circuit (ASIC), or memory chips such as a volatile memory (for example, DRAM), a non-volatile memory (for example, ROM, flash memory), and a high bandwidth memory (HBM). In addition, the chips may be arranged in combination with each other. As a non-limiting example, the first semiconductor chip 111 and the third semiconductor chip 113 may be the memory chips such as the HBM, and the second semiconductor chip 112 may be the processor chips such as an AP but is not limited thereto. The semiconductor chips 111, 112, and 113 may be electrically connected to each other through the connection member 120.

The semiconductor chips 111, 112, and 113 each may be integrated circuits (ICs) in which hundreds to millions of devices are integrated into one chip. In this case, silicon (Si), germanium (Ge), gallium arsenide (GaAs), or the like may be used as a base material of each body. Various circuits may be formed in each body. The connection pads 111P, 112P and 113P of each of the semiconductor chips 111, 112 and 113 are for electrically connecting the respective semiconductor chips 111, 112 and 113 to other components, and as the formation material of the connection pads 111P, 112P, and 113P, a conductive material such as aluminum (Al) may be used without any particular limitation. The passivation film exposing the connection pads 111P, 112P, and 113P may be formed on each body. The passivation film may be an oxide film, a nitride film, or the like and may be a double layer of the oxide film and the nitride film. The insulating film or the like may be further disposed at a necessary position. If necessary, the redistribution layer may be further formed on the active surfaces of the semiconductor chips 111, 112 and 113, and bumps 111B, 112B and 113B or the like may be connected to the connection pads 111P, 112P and 113P. The bumps 111B, 112B, and 113B may be formed of metal or solder. The semiconductor chips 111, 112 and 113 may be connected to the pad layer 122c exposed on the connection member 120 through the connection pads 111P, 112P and 113 and/or the bumps 111B, 112B and 113B. The bonding member 115 such as a solder and a micro bump may be used for the connection. Each of the semiconductor chips 111, 112, and 113 may be fixed on the connection member 120 with a known underfill resin 170.

The connection member 120 redistributes the connection pads 111P, 112P, and 113P of each of the semiconductor chips 111, 112, and 113. The connection pads 111P, 112P and 113P of tens to hundreds of semiconductor chips 111, 112 and 113 having various functions may be redistributed through the connection member 120, and may be physically and/or electrically connected to the outside through the electrical connection structure in accordance with the function. The connection member 120 includes the insulating layer 121, the redistribution layer 122 formed on the insulating layer or in the insulating layer 121, and the via 123 penetrating through the insulating layer 121 and electrically connecting the redistribution layers formed on different layers. The number of layers of the connection member 120 may be larger or smaller than that shown in the drawing. This type of connection member 120 may be used as a 2.5D type organic interposer.

The connection member 120 may include a lowermost first insulating layer 121a, a second insulating layer 121b in which the UBM layer 140 is embedded, a third insulating layer 121c on the UBM layer 140, a first redistribution layer 122a embedded in the third insulating layer 121c to be in contact with the UBM via 143, and a first via 123a penetrating through at least a portion of the third insulating layer 121c and electrically connecting the first redistribution layer 122a with the second redistribution layer 122b. The connection member 120 may be configured by repeatedly stacking the third insulating layer 121c, the second redistribution layer 122b, and the first via 123a. In addition, the connection member 120 may include a pad layer 122c disposed on the uppermost insulating layer 121 in contact with the sealing member 160 and/or the underfill resin 170. The pad layer 122c may correspond to a portion of the redistribution layer 122 and may serve as a pad for mounting the semiconductor chips 111, 112 and 113. In addition, the lowermost first insulating layer 121a may serve as the passivation layer, and may include a material different from the second and third insulating layers 121b and 121c according to the exemplary embodiments.

As the material of the insulating layer 121, an insulating material may be used. In this case, as the insulating material, a thermosetting resin such as an epoxy resin, a thermoplastic resin such as polyimide, or a resin in which these resins are mixed with inorganic filler, for example, an ajinomoto build-up film (ABF) and the like may be used. Alternatively, a photosensitive insulating material such as a photo imageable dielectric (PID) resin may be used. That is, the insulating layers 121 each may be a photosensitive insulating layer. If the insulating layer 121 has photosensitive properties, the insulating layer 121 may be formed thinner and a fine pitch of the via 123 may be more easily achieved. If the insulating layer 121 is formed in multiple layers, these materials may be the same as each other or may be different from each other as needed. If the insulating layer 121 is formed in multiple layers, they may be integrated according to the process, and thus a boundary therebetween may not be apparent.

The redistribution layer 122 may serve to substantially redistribute the connection pads 111P, 112P, and 113P and as the formation material thereof, a conductive material such as copper (Cu), aluminum (Al), silver (Ag), tin (Sn), gold (Au), nickel (Ni), lead (Pb), and titanium (Ti) or an alloy thereof may be used. The redistribution layer 122 may perform various functions according to the design of the corresponding layer. For example, the redistribution layer 122 may include a ground (GND) pattern, a power (PWR) pattern, a signal (S) pattern or the like. Here, the signal (S) pattern may include various signals, for example, a data signal or the like, except for the ground (GND) pattern, the power (PWR) pattern, or the like. In addition, the signal (S) pattern may include a via pad, a connection terminal pad, and the like. The surface treatment layer 130 may be formed on the surface of the pad layer 122c in the redistribution layer 122.

The via 123 may electrically connect between the redistribution layers 122 and the like which are formed on different layers, thereby forming the electrical path in the package 100A. As the formation material of the via 123, conductive materials such as copper (Cu), aluminum (Al), silver (Ag), tin (Sn), gold (Au), nickel (Ni), lead (Pb), and titanium (Ti) or an alloy thereof may be used. The via 123 may be fully filled with the conductive material, but is not limited thereto. The cross-sectional shape of the via 123 may have a substantially inverted trapezoidal shape with reference to the drawing.

The surface treatment layer 130 includes first and second surface treatment layers 132 and 134. The first and second surface treatment layers 132 and 134 may be layers formed of different materials, and the first surface treatment layer 132 may be disposed on an upper portion and the second surface treatment layer 134 may be disposed between the first surface treatment layer 132 and the pad layer 122c. For example, the first surface treatment layer 132 may be formed of gold (Au), and the second surface treatment layer 134 may be formed of nickel (Ni). The surface treatment layer 130 may be formed only on the upper surface of the pad layer 122c to expose the side surface of the pad layer 122c. The side surface of the pad layer 122c exposed from the surface treatment layer 130 may be in contact with the underfill resin 170 and at least a portion of the side surface of the pad layer 122c may be in contact with the bonding member 115 according to the exemplary embodiment.

The UBM layer 140 may improve the connection reliability of the electrical connection structure 150, thereby improving the board level reliability of the package 100A. The UBM layer 140 may include an UBM pad 142 embedded in the second insulating layer 121b at a lower portion of the connection member 120, an UBM via 143 embedded in the second insulating layer 121b to electrically connect the redistribution layer 122 of the connection member 120 with the UBM pad 142, first and second plating layers 145 and 146 embedded in the second insulating layer 121b and disposed on a portion of the UBM pad 142, and a metal layer 149 disposed between the first plating layer 145 and the first insulating layer 121a. The electrical connection structure 150 may be disposed on the first plating layer 145 and is disposed to protrude to a lower portion of the first insulating layer 121a.

The first and second plating layers 145 and 146 may correspond to the surface treatment layer of the UBM pad 142. As the formation material of the first and second plating layers 145 and 146, the conductive material such as copper (Cu), aluminum (Al), silver (Ag), tin (Sn), gold (Au), nickel (Ni), lead (Pb), and titanium (Ti) or an alloy thereof may be used. For example, the first plating layer 145 may be a gold (Au) plating layer, and the second plating layer 146 may be a nickel (Ni) plating layer. However, the number of layers constituting the first and second plating layers 145 and 146 is not limited thereto. In this embodiment, the material and the stacked structure of the first and second plating layers 145 and 146 may be the same as the surface treatment layer 130, but are not limited thereto.

The metal layer 149 may be a seed layer for forming the first and second plating layers 145 and 146. The metal layer 149 may be partially removed at the time of forming an opening 151 for forming the electrical connection structure 150 during the manufacturing process and may remain only in a region covered with the first insulating layer 121a. The metal layer 149 may include a conductive material, for example, a titanium (Ti) layer and a copper (Cu) layer.

The electrical connection structure 150 may be disposed in the opening 151, from which the first insulating layer 121a is removed, to physically and/or electrically connect the semiconductor package 100A to the outside. For example, the semiconductor package 100A may be mounted on the main board of the electronic device through the electrical connection structure 150. Therefore, the electrical connection structure 150 may be larger in size and diameter than the bonding member 115. In addition, the electrical connection structure 150 may be disposed on the first plating layer 145 and the opening 151 may be formed smaller than the first plating layer 145 to expose a portion of the first plating layer 145. The electrical connection structure 150 may be formed of a conductive material, for example, a solder, but is merely an example and the material thereof is not particularly limited thereto. The electrical connection structure 150 may be a land, a ball, a pin, or the like. The electrical connection structure 150 may be formed of multiple layers or a single layer. When the electrical connection structure is formed in multiple layers, the electrical connection structure may include a copper pillar and a solder. When the electrical connection structure is formed in a single layer, the electrical connection structure may include a tin-silver solder or copper, but is merely an example and is not limited thereto.

The number, interval, disposition form or the like of the electrical connection structure 150 are not particularly limited and may be sufficiently modified according to design specifications by those skilled in the art. For example, the number of electrical connection structures 150 may be tens to thousands depending on the number of connection pads 111P, 112P, and 113P, and may have more or less numbers. Some of the electrical connection structures 150 may be disposed in a fan-out region. The fan-out region may mean a region out of the region in which the semiconductor chips 111, 112, and 113 are disposed. That is, the semiconductor package 100A according to an example may be a fan-out semiconductor package. The fan-out package may be more reliable than the fan-in package, and may implement many I/O terminals and facilitate a 3D interconnection. In addition, the package may be manufactured thinner than a ball grid array (BGA) package and a land grid array (LGA) package, and the price competitiveness may be excellent.

The sealing member 160 may protect the semiconductor chips 111, 112, 113, and the like. The sealing form is not particularly limited and therefore any sealing form may be allowed as long as it may enclose at least a portion of the first semiconductor chip 112. The material of the sealing member 160 is not particularly limited. For example, the insulating material may be used. In this case, as the insulating material, a thermosetting resin such as an epoxy resin, a thermoplastic resin such as polyimide, or a material in which these resins are mixed with inorganic filler, for example, an ajinomoto build-up film (ABF) and the like may be used. However, the example of the insulating material of the present disclosure is not limited thereto, and prepreg including a glass fiber, or the like may also be used. Alternatively, the known epoxy molding compound (EMC) or the like may also be used.

The underfill resin 170 may fix the semiconductor chips 111, 112, and 113 on the connection member 120. As the underfill resin 170, the known material including epoxy and the like may be applied. If necessary, the underfill resin 170 may be omitted. Meanwhile, although not shown in the drawing, passive components may be packaged by being disposed in parallel with the semiconductor chips 111, 112, and 113 on the connection member 120, if necessary.

Figure 7:
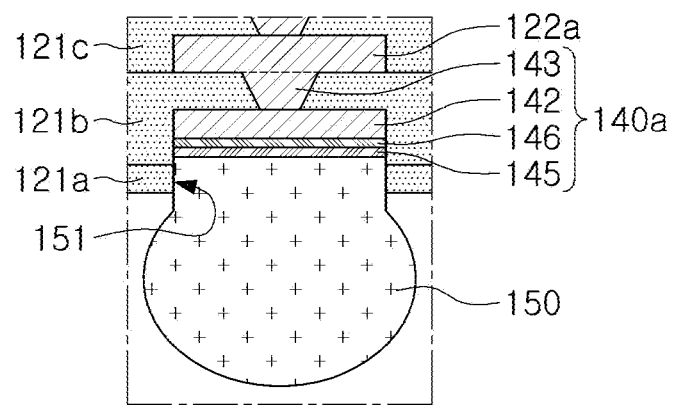
FIG. 7 is an enlarged view schematically showing another example of the semiconductor package including the organic interposer.

FIG. 7 is a cross-sectional view schematically showing another example of the semiconductor package including the organic interposer.

Referring to FIG. 7, a region corresponding to the enlarged view of FIG. 6 is shown. In this embodiment, the opening 151 in which the electrical connection structure 150 is disposed is formed to have the same size or width as the first and second plating layers 145 and 146. Therefore, the entire lower surface of the first plating layer 145 is exposed downward from the first and second insulating layers 121a and 121b to be in contact with the electrical connection structure 150. Therefore, unlike the exemplary embodiment of FIG. 6, the UBM layer 140a may not include the metal layer 149 by removing all the metal layer 149 disposed between the first insulating layer 121a and the first plating layer 145. Other configurations are substantially the same as those described in the semiconductor package 100A according to the above-described example.

FIGS. 8A through 8J are diagrams schematically showing an example of a process of forming the semiconductor package including the organic interposer of FIG. 6.

Figure 8A:
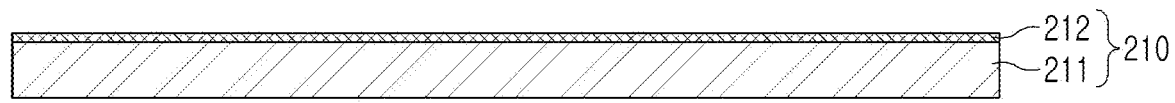
FIGS. 8A through 8J are diagrams schematically showing an example of a process of forming the semiconductor package including the organic interposer of FIG. 6.

Referring to FIG. 8A, the carrier 210 is prepared. The carrier 210 may include a core layer 211 and a release layer 212 formed on the core layer 211. The core layer 211 may be glass, an insulating resin, inorganic filler, and for example, a prepreg including a glass fiber. The release layer 212 may include, for example, a metal such as copper (Cu) or titanium (Ti), and may be surface-treated to be easily separated. The carrier 210 may be a glass carrier or may be a typical detach core according to the exemplary embodiments.

Figure 8B:
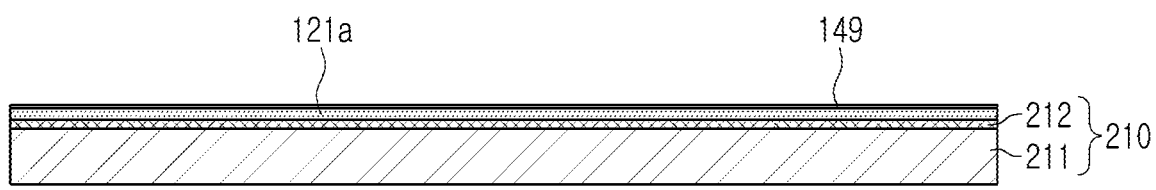

Referring to FIG. 8B, the first insulating layer 121a and the metal layer 149 may be sequentially formed on the carrier 210. The first insulating layer 121a may be formed using a thermosetting resin such as an epoxy resin, a thermoplastic resin such as polyimide, or a photosensitive insulating material such as a photo imageable dielectric (PID) resin. The metal layer 149 may be formed by a sputtering process and may be formed of, for example, a double layer of titanium (Ti)/copper (Cu).

Figure 8C:
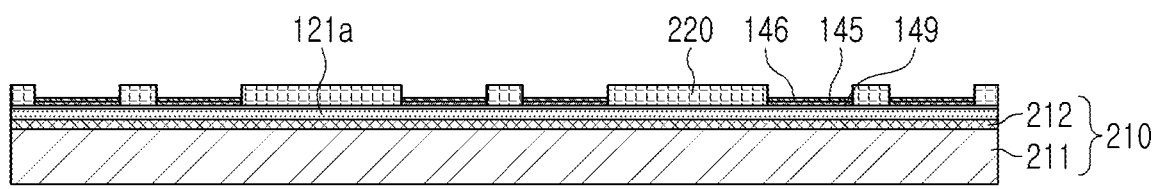

Referring to FIG. 8C, a pattern layer 220 may be formed on the metal layer 149, and then the first and second plating layers 145 and 146 may be sequentially formed. The pattern layer 220 may be formed of a photoresist layer or a dry film. The first and second plating layers 145 and 146 may be formed by filling the space between the pattern layers 220 by an electrolytic plating process. The first and second plating layers 145 and 146 may be formed on the metal layer 149 which is a seed layer. In particular, the first and second plating layers 145 and 146 may be formed by the electrolytic plating, and may prevent defects such as blurring around the pattern that may occur when being formed by the electroless plating. The first and second plating layers 145 and 146 may be formed to have the same size and width, but are not limited thereto.

Figure 8D:
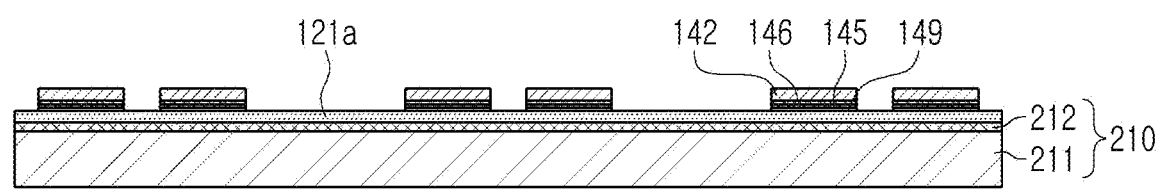

Referring to FIG. 8D, the UBM pad 142 may be formed to cover the first and second plating layers 145 and 146, and the pattern layer 220 may be removed. The UBM pad 142 may be formed on the first and second plating layers 145 and 146. Next, the metal layer 149 under the pattern layer 220 may be removed.

Figure 8E:
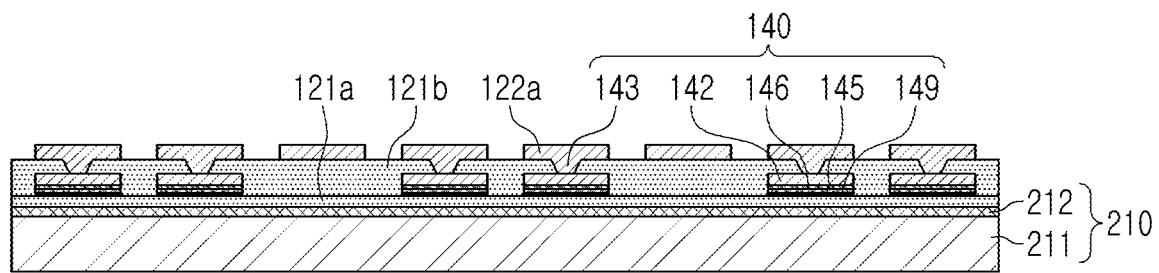

Referring to FIG. 8E, the second insulating layer 121b may be formed and the second insulating layer 121b may be patterned, thereby forming the via 143 connected to the UBM pad 142. The second insulating layer 121b may be formed by a lamination method or an applying method. The via 143 may be formed by forming a via hole by a photo-lithography method, a mechanical drill and/or a laser drill, and the like and burying the via hole with a conductive material. As a result, the UBM layer 140 may be formed.

Figure 8F:
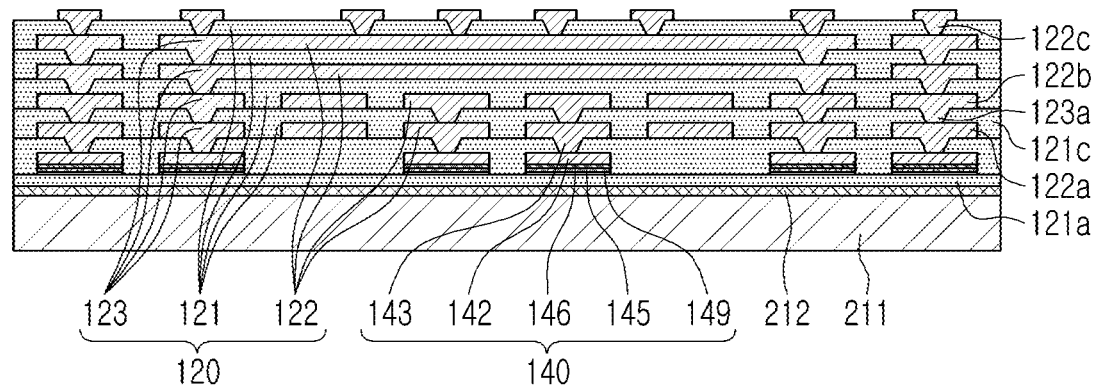

Referring to FIG. 8F, components other than the first redistribution layer 122a may be further formed on the second insulating layer 121b and the UBM layer 140 to form the connection member 120. The connection member 120 and the UBM layer 140 may be continuously formed in the same line. The insulating layer 121 may be formed by a method of laminating or coating a PID or the like. The redistribution layer 122 and the via 123 may be formed by forming a pattern using a dry film or the like, and then filling the pattern with the plating method. As the plating method, a subtractive process, an additive process, a semi-additive process (SAP), a modified semi-additive process (MSAP), and the like may be used, but the plating method is not limited thereto. In a process according to another example, the carrier 210 on which the UBM pad 142 is formed may be coupled to the manufactured connection member 120 as shown in FIG. 8D to perform the subsequent processes.

Figure 8G:
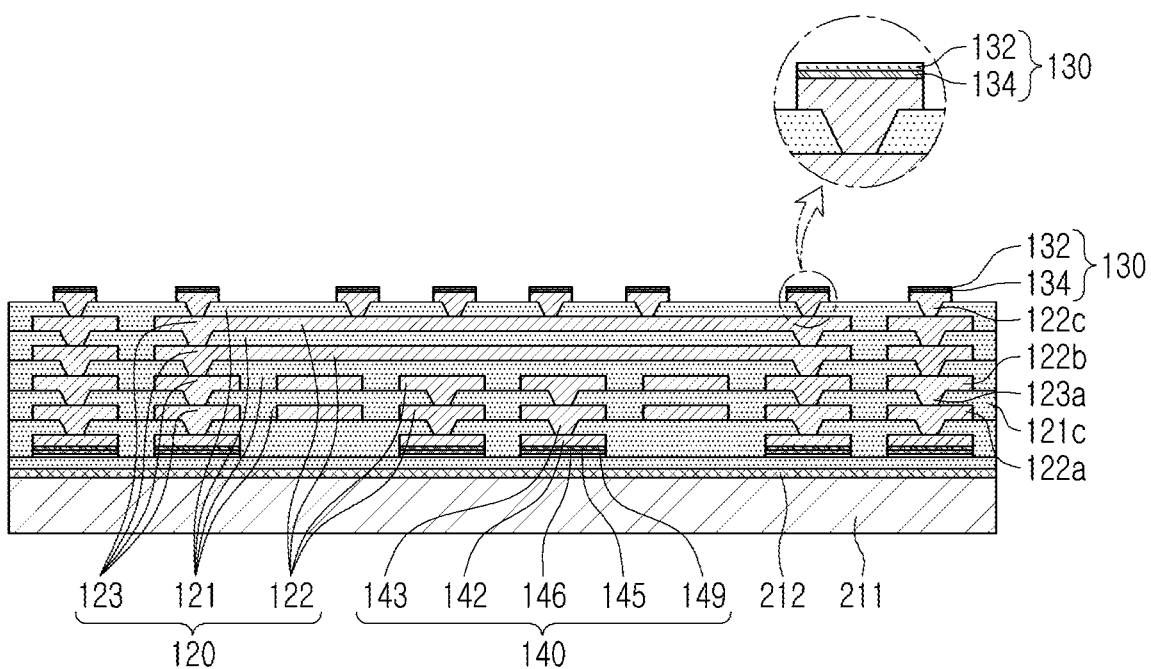

Referring to FIG. 8G, the surface treatment layer 130 may be formed on the pad layer 122c formed on the connection member 120. The second surface treatment layer 134 in contact with the pad layer 122c may be first formed, and the first surface treatment layer 132 may be formed on the second surface treatment layer 134. The surface treatment layer 130 may be formed by the electrolytic plating process. In particular, the surface treatment layer 130 may be formed by performing the electrolytic plating process using the seed layer and the pattern layer used for forming the pad layer 122c and the via 143 connected to the pad layer 122c as they are. Therefore, a separate electrolytic lead-in removal process may not be added. Next, sawing may be performed at a unit smaller than a panel level, for example, a strip level, and a quad route inspection and an electrical inspection of the redistribution layer 122 may be performed as necessary. Thus, all of the surface treatment layer 130 and the first and second plating layers 145 and 146 may be formed at the panel level, and the process may be made efficient.

Figure 8H:
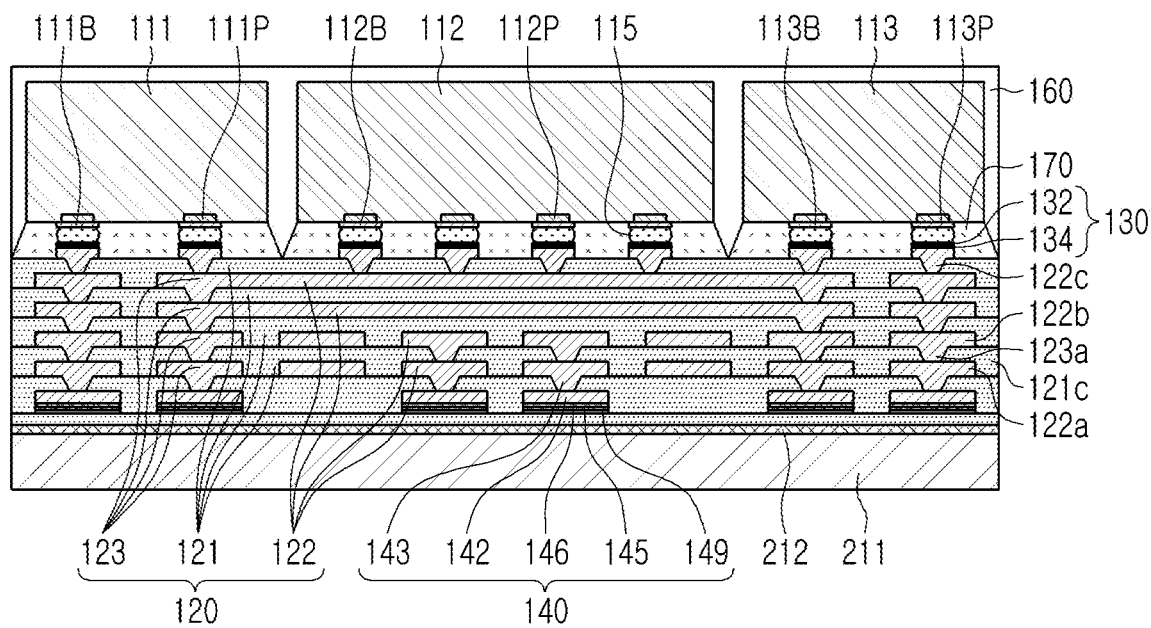

Referring to FIG. 8H, the semiconductor chips 111, 112 and 113 may be mounted on the connection member 120 to form the sealing member 160 for sealing the semiconductor chips 111, 112 and 113. The bonding member 115 such as a micro bump may be used for mounting. Thereafter, the semiconductor chips 111, 112, and 113 may be fixed with the underfill resin 170. The sealing member 160 may be formed by laminating a film form or by applying and curing a liquid form.

Figure 8I:
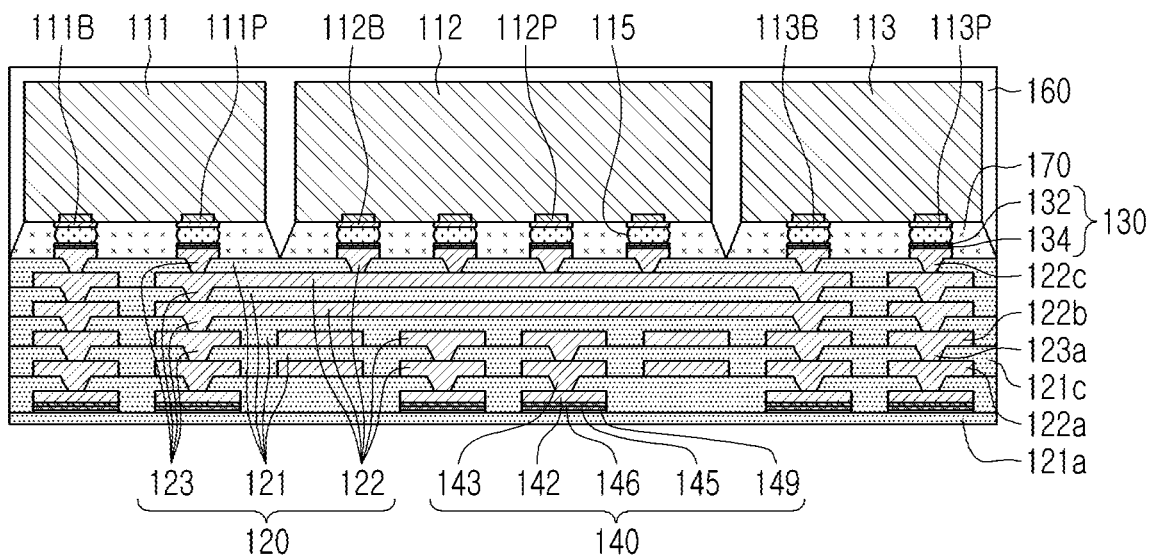

Referring to FIG. 8I, the carrier 210 is separated from the connection member 120 and the semiconductor chips 111, 112, and 113. The carrier 210 may be separated by the separation of the release layer 212, and the remaining release layer 212 may be removed by an etching process. As a result, the lowermost first insulating layer 121a may be exposed.

Figure 8J:
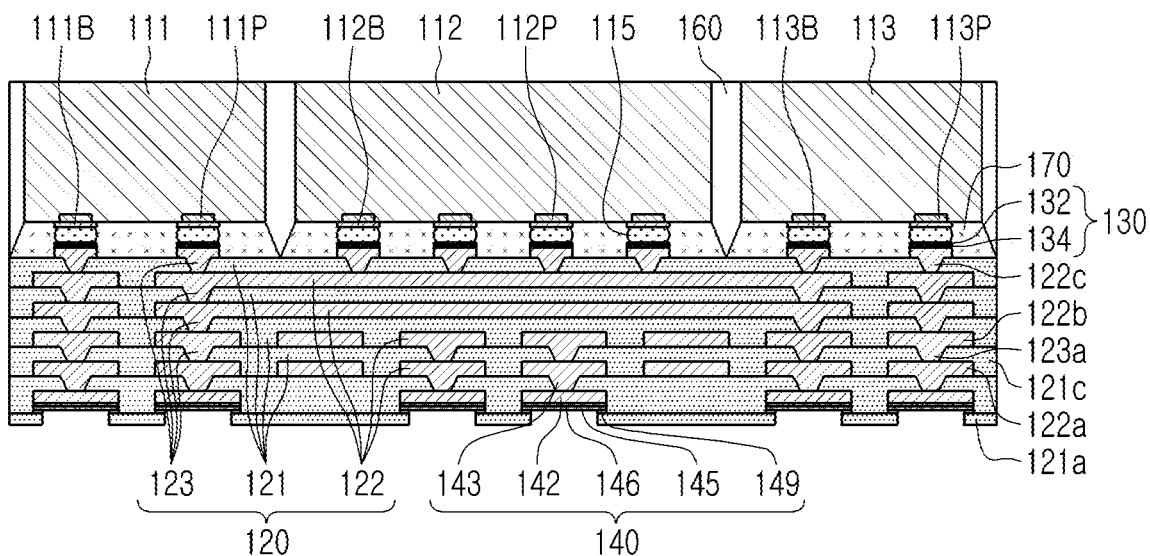

Referring to FIG. 8J, a descum etching process for removing a portion of the first insulating layer 121a may be performed, and a plasma etching process for removing the exposed metal layer 149 may be performed. Thus, the first plating layer 145 may be exposed from the first insulating layer 121a. On the other hand, the sealing member 160 may be subjected to a grinding process if necessary. The upper surfaces of each of the semiconductor chips 111, 112, and 113 may be positioned at the same level by grinding. That is, the thicknesses of the semiconductor chips 111, 112, and 113 can be substantially the same. However, the grinding process may be performed after the formation of the electrical connection structure 150 or may be omitted.

Next, referring to FIG. 6, the process of attaching and reflowing the electrical connection structure 150 may be performed. The semiconductor package 100A according to the above-described example may be manufactured through a series of processes.

Figure 9:
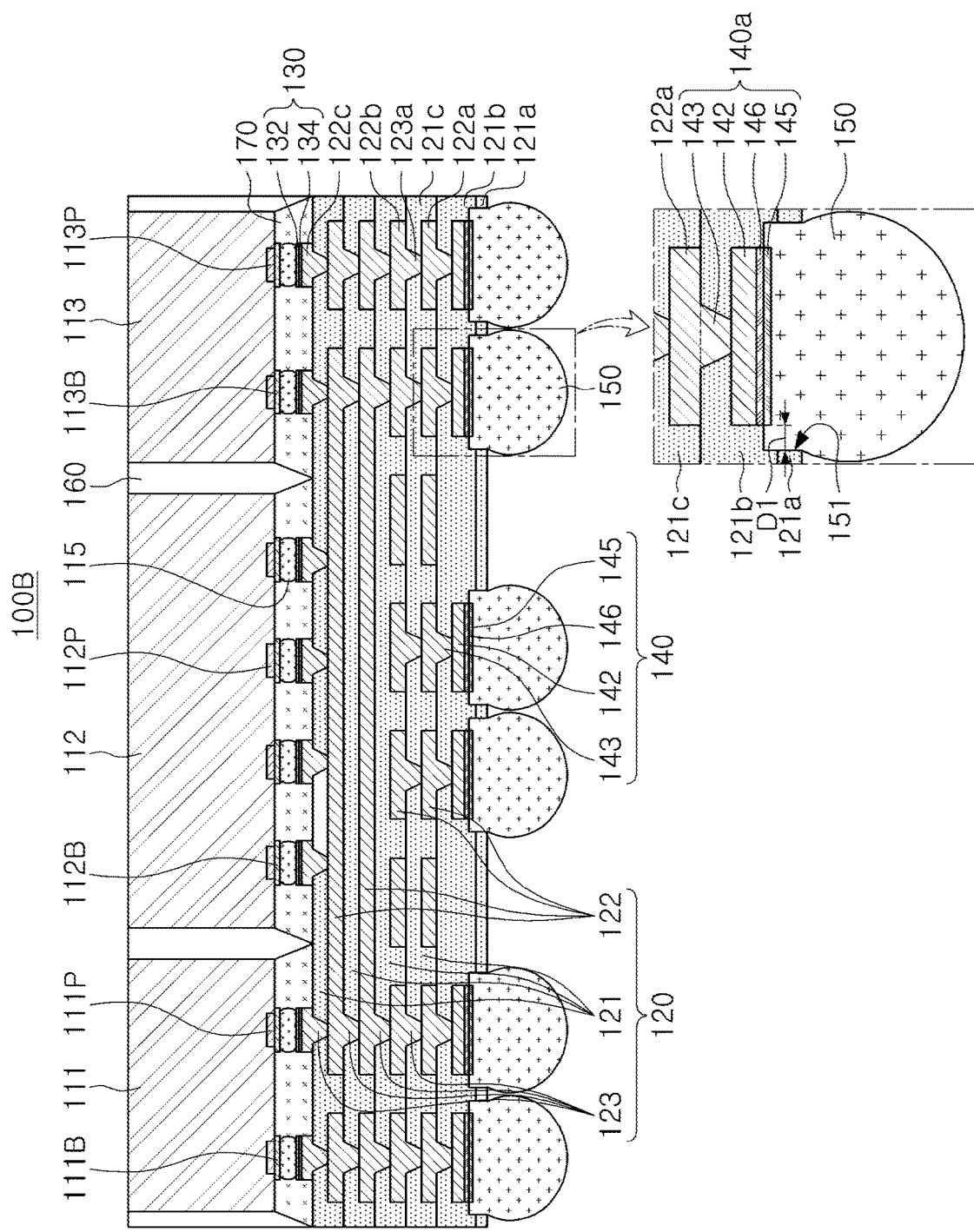
FIG. 9 is a cross-sectional view schematically showing another example of the semiconductor package including the organic interposer.

FIG. 9 is a cross-sectional view schematically showing another example of the semiconductor package including the organic interposer.

Referring to FIG. 9, in a semiconductor package 100B including an organic interposer according to another example, a side surface of the first plating layer 145 of the UBM layer 140 may be horizontally spaced apart from a side surface of the second insulating layer 121b surrounding the first and second plating layers 145 and 146. That is, unlike the exemplary embodiment of FIG. 6, the opening 151 in which the electrical connection structure 150 is disposed is wider than the first and second plating layers 145 and 146, and may be formed so that a portion of the side surfaces of the first and second plating layers 145 and 145, for example, a side surface of the first plating layer 145 is exposed. Therefore, the side surfaces of the first and second insulating layers 121a and 121b forming the openings 151 may be spaced apart from the side surface of the first plating layer 145 by a first length D1. The first length D1 may be variously selected in the embodiments. The electrical connection structure 150 may fill between the side surface of the first plating layer 145 and the first and second insulating layers 121a and 121b. The entire lower surface of the first plating layer 145 is exposed downward from the first and second insulating layers 121a and 121b to be in contact with the electrical connection structure 150. Therefore, as in the exemplary embodiment of FIG. 7, the UBM layer 140a may not include the metal layer 149 by removing all the metal layer 149 disposed between the first insulating layer 121a and the first plating layer 145. Other configurations are substantially the same as those described in the semiconductor package 100A according to the above-described example.

Figure 10:
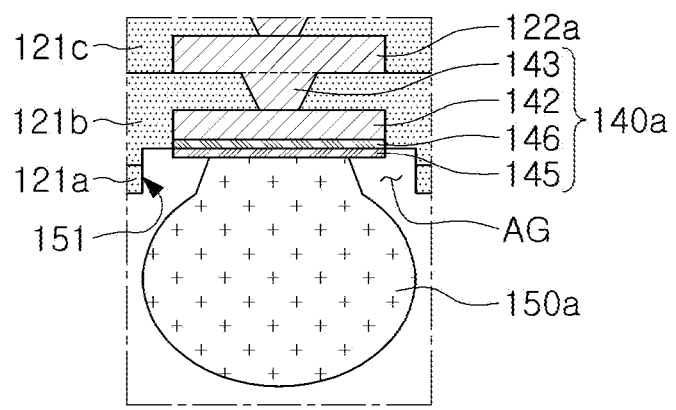
FIG. 10 is a cross-sectional view schematically showing another example of the semiconductor package including the organic interposer.

FIG. 10 is a cross-sectional view schematically showing another example of the semiconductor package including the organic interposer.

Referring to FIG. 10, a region corresponding to the enlarged view of FIG. 9 is shown. Unlike the exemplary embodiment of FIG. 9, in this exemplary embodiment, the electrical connection structure 150a may not fill between the side surface of the first plating layer 145 and the first and second insulating layers 121a and 121b. An air gap AG may be formed between the side surface of the first plating layer 145 and the first and second insulating layers 121a and 121b and the side surface of the first plating layer 145 may be exposed to the outside. Other configurations are substantially the same as those described in the semiconductor package 100A according to the above-described example.

Figure 11:
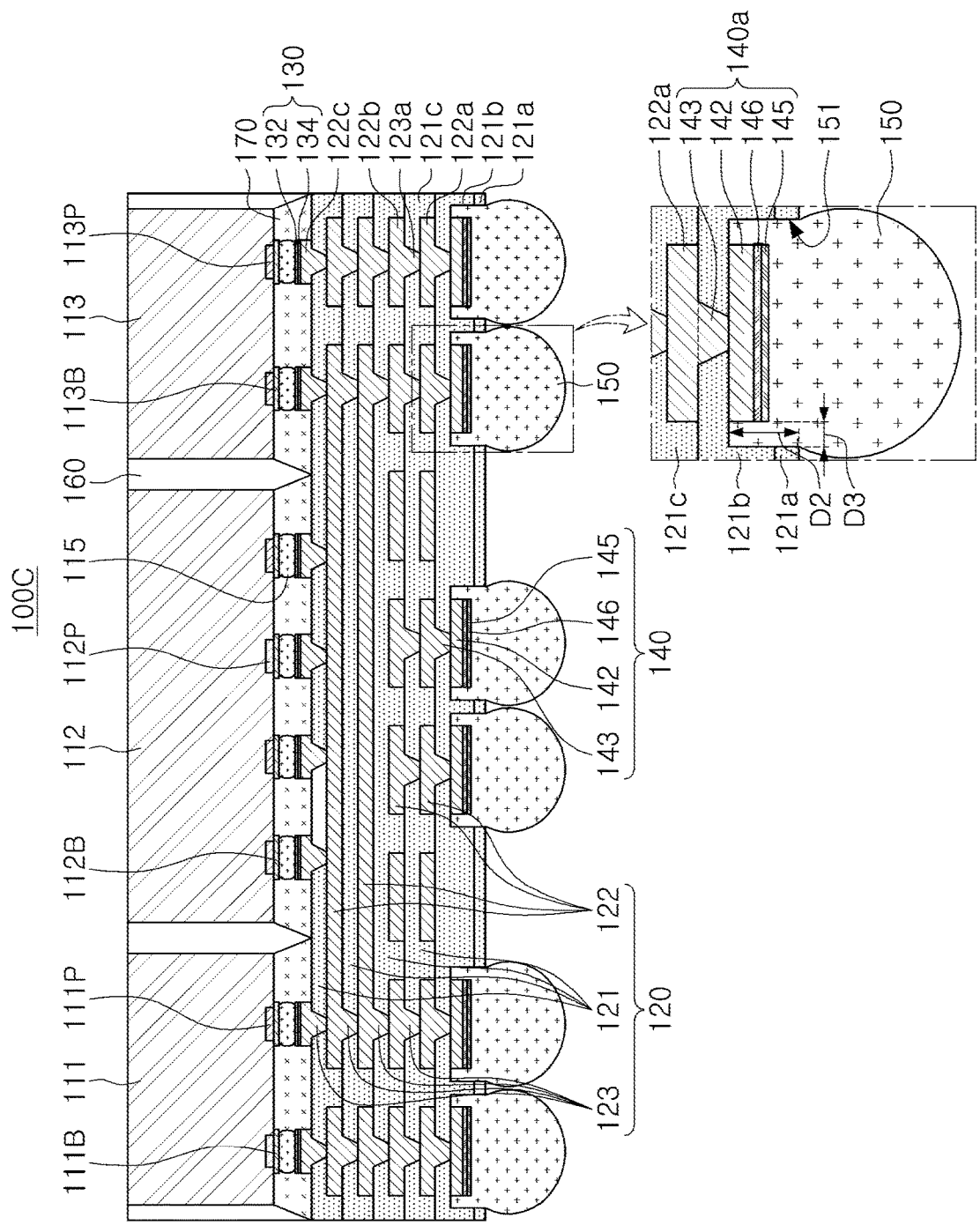
FIG. 11 is a cross-sectional view schematically showing another example of the semiconductor package including the organic interposer.

FIG. 11 is a cross-sectional view schematically showing another example of the semiconductor package including the organic interposer.

Referring to FIG. 11, in a semiconductor package 100C including an organic interposer according to another example, the side surfaces of the first and second plating layers 145 and 146 of the UBM layer 140 may be horizontally spaced apart from the side surface of the second insulating layer 121b surrounding the first and second plating layers 145 and 146. That is, unlike the exemplary embodiment of FIG. 9, the opening 151 in which the electrical connection structure 150 is disposed may be formed so that the side surfaces of the first and second plating layers 145 and 146 are completely exposed. Therefore, a lower surface of the second insulating layer 121b exposed downward from a circumference of the first and second plating layers 145 and 146 may be spaced apart from a lower surface of the first insulating layer 121a toward the upper portion by a second length D2. In addition, the side surfaces of the first and second insulating layers 121a and 121b forming the opening 151 may be spaced apart from the side surface of the first plating layer 145 by a third length D3. The second and third lengths D2 and D3 may be variously selected in the embodiments. The electrical connection structure 150 may fill between the side surfaces of the first plating layer 145, the second plating layer 146, and the UBM pad 142, and the first and second insulating layers 121a and 121b, or as in the exemplary embodiment of FIG. 10, the electrical connection structure 150 may be disposed to form the air gap. Other configurations are substantially the same as those described in the semiconductor packages 100A and 100B according to the above-described example.

Figure 12:
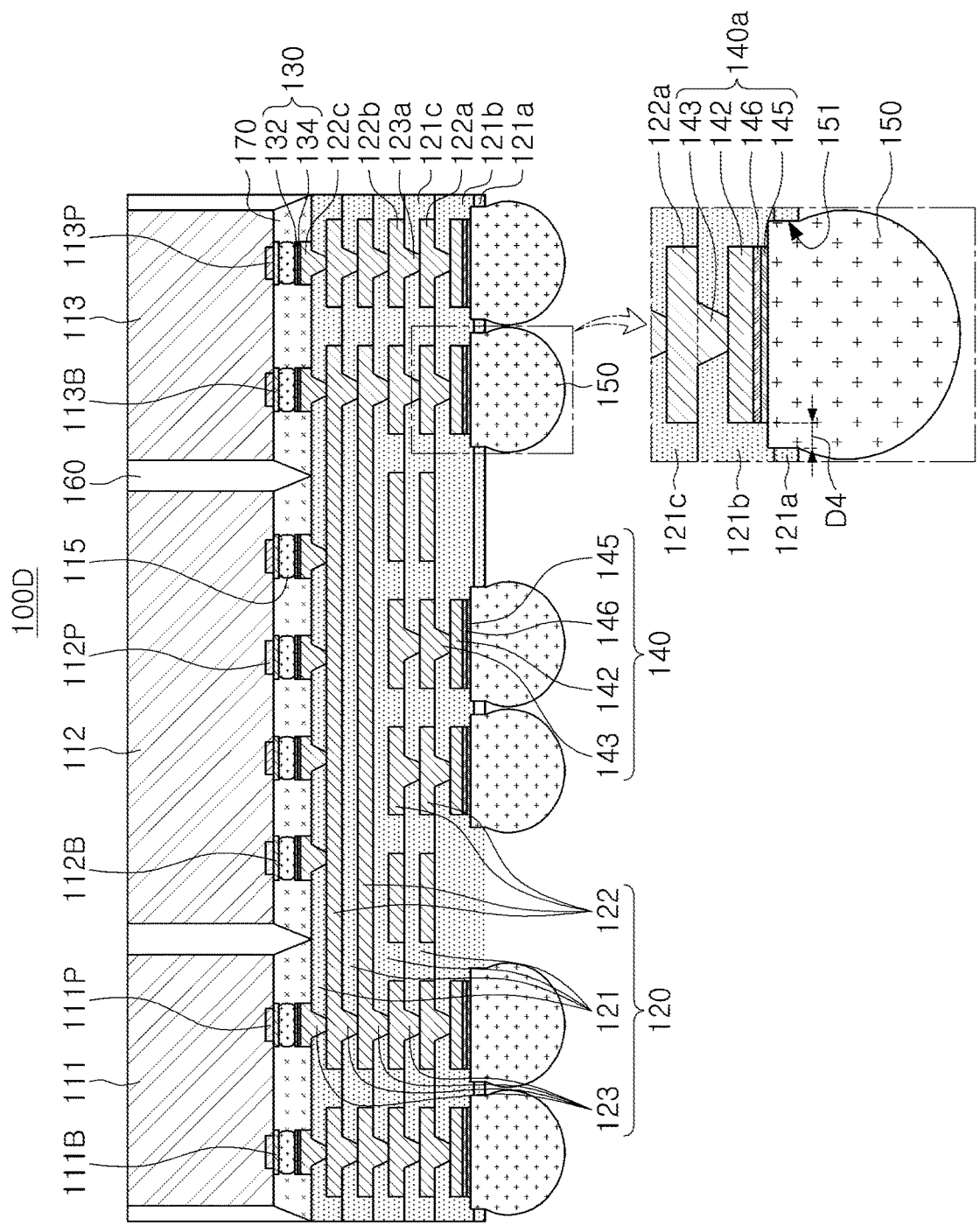
FIG. 12 is a cross-sectional view schematically showing another example of the semiconductor package including the organic interposer.

FIG. 12 is a cross-sectional view schematically showing another example of the semiconductor package including the organic interposer.

Referring to FIG. 12, in a semiconductor package 100D including an organic interposer according to another example, the lower surface of the first plating layer 145 of the UBM layer 140 may be coplanar with the lower surface of the second insulating layer 121b at the circumference of the first plating layer 145. That is, unlike the embodiment of FIG. 9, the side surfaces of the first and second plating layers 145 and 146 may not be exposed and may be surrounded by the second insulating layer 121b. In addition, the opening 151 in which the electrical connection structure 150 is disposed may be formed widely toward the outside of the lower surface of the first and second plating layers 145 and 146. Therefore, the side surfaces of the first and second insulating layers 121a and 121b forming the openings 151 may be spaced apart from the side surface of the first plating layer 145 by a fourth length D4. The electrical connection structure 150 may fill the entire opening 151, or may be disposed to form the air gap as in the embodiment of FIG. 10. Other configurations are substantially the same as those described in the semiconductor packages 100A and 100B according to the above-described example.

As set forth above, an exemplary embodiment of the present disclosure may provide the semiconductor package including the organic interposer capable of simplifying the process and preventing the occurrence of defects in the surface treatment layer and the UBM layer.

While exemplary embodiments have been shown and described above, it will be apparent to those skilled in the art that modifications and variations could be made without departing from the scope of the present invention as defined by the appended claims.

What is claimed is:

1. A semiconductor package, comprising:
a semiconductor chip having an active surface on which a connection pad is disposed;
a connection member disposed on the active surface of the semiconductor chip and including a pad layer disposed on an upper surface thereof, a redistribution layer electrically connected to the connection pad, and an insulating layer;
a bonding member disposed between the connection pad of the semiconductor chip and the pad layer of the connection member to connect the semiconductor chip with the connection member;
a surface treatment layer disposed on an upper surface of the pad layer of the connection member and including at least one metal layer; and
an under-bump metallurgy (UBM) layer embedded in the connection member and electrically connected to the redistribution layer of the connection member,
wherein the UBM layer includes a UBM pad embedded in the insulating layer of the connection member, at least one plating layer disposed on the UBM pad, and a UBM via penetrating through at least a portion of the insulating layer of the connection member and electrically connecting the redistribution layer of the connection member with the UBM pad,
the surface treatment layer is disposed only on one surface of the pad layer facing the bonding member, and the plating layer of the UBM layer is disposed only on one surface of the UBM pad opposing the UBM via,
the surface treatment layer is substantially planar,
the surface treatment layer and the plating layer of the UBM layer include the same electrolytic metal layers,
the surface treatment layer includes a first plating layer including gold (Au), and a second plating layer disposed between the pad layer and the first plating layer and including nickel (Ni), and the plating layer of the UBM layer includes a third plating layer including gold (Au), and a fourth plating layer disposed between the UBM pad and the third plating layer and including nickel (Ni).

2. The semiconductor package of claim 1, wherein at least a portion of a side surface of the plating layer of the UBM layer is spaced apart from a side surface of the insulating layer of the connection member surrounding the plating layer of the UBM layer.

3. The semiconductor package of claim 1, further comprising:
an electrical connection structure disposed on the plating layer of the UBM layer.

4. The semiconductor package of claim 3, wherein the electrical connection structure extends between at least a portion of a side surface of the plating layer of the UBM layer and the insulating layer of the connection member.

5. The semiconductor package of claim 3, wherein an air-gap exists between at least a portion of a side surface of the plating layer of the UBM layer and the insulating layer of the connection member.

6. The semiconductor package of claim 3, further comprising:
a resin layer surrounding the bonding member between the semiconductor chip and the connection member,
wherein a side surface of the pad layer is in contact with the resin layer, and at least a portion of a side surface of the plating layer of the UBM layer is in contact with the electrical connection structure.

7. The semiconductor package of claim 3, wherein the electrical connection structure has a diameter greater than a diameter of the bonding member.

8. A semiconductor package, comprising:
a semiconductor chip having an active surface on which a connection pad is disposed;
a connection member disposed on the active surface of the semiconductor chip and including a pad layer disposed on an upper surface thereof, a redistribution layer electrically connected to the connection pad, and an insulating layer;
a bonding member disposed between the connection pad of the semiconductor chip and the pad layer of the connection member to connect the semiconductor chip with the connection member;
a resin layer surrounding the bonding member between the semiconductor chip and the connection member;
a surface treatment layer disposed on an upper surface of the pad layer of the connection member and including at least one metal layer;
an under-bump metallurgy (UBM) layer embedded in the connection member and electrically connected to the redistribution layer of the connection member; and
an electrical connection structure disposed on the plating layer of the UBM layer,
wherein the UBM layer includes a UBM pad embedded in the insulating layer of the connection member, at least one plating layer disposed on the UBM pad, and a UBM via penetrating through at least a portion of the insulating layer of the connection member and electrically connecting the redistribution layer of the connection member with the UBM pad, and
the surface treatment layer is disposed only on one surface of the pad layer facing the bonding member, and the plating layer of the UBM layer is disposed only on one surface of the UBM pad opposing the UBM via,
wherein a side surface of the pad layer is in contact with the bonding member or the resin layer, and at least a portion of a side surface of the plating layer of the UBM layer is exposed to the outside.

9. The semiconductor package of claim 1, wherein the surface treatment layer has a diameter smaller than a diameter of the plating layer of the UBM layer.

10. The semiconductor package of claim 1, wherein the semiconductor chip includes a processor chip and a memory chip, and the processor chip and the memory chip are electrically connected by the connection member.

11. The semiconductor package of claim 1, wherein the insulating layer of the connection member is made of an organic material.

12. A semiconductor package, comprising:
a semiconductor chip having an active surface on which a connection pad is disposed;
a connection member disposed on the active surface of the semiconductor chip and including a pad layer disposed on an upper surface thereof, a redistribution layer electrically connected to the connection pad, and an insulating layer;
a bonding member disposed between the connection pad of the semiconductor chip and the pad layer of the connection member to connect the semiconductor chip with the connection member;
a surface treatment layer disposed on an upper surface of the pad layer of the connection member and including at least one metal layer; and
an under-bump metallurgy (UBM) layer embedded in the connection member and electrically connected to the redistribution layer of the connection member,
wherein the UBM layer includes a UBM pad embedded in the insulating layer of the connection member, at least one plating layer disposed on the UBM pad, and a UBM via penetrating through at least a portion of the insulating layer of the connection member and electrically connecting the redistribution layer of the connection member with the UBM pad, and
the surface treatment layer is disposed only on one surface of the pad layer facing the bonding member and includes a first electrolytic plating layer including gold (Au) and a second electrolytic plating layer including nickel (Ni), and the plating layer of the UBM layer is disposed only on one surface of the UBM pad opposing the UBM via and includes a third electrolytic plating layer including gold (Au) and a fourth electrolytic plating layer including nickel (Ni).

13. The semiconductor package of claim 12, wherein a portion of a lower surface of the plating layer of the UBM layer is covered with the insulating layer of the connection member, and
a metal layer disposed between the plating layer and the insulating layer is provided on the lower surface of the plating layer of the UBM layer.

14. The semiconductor package of claim 13, wherein the metal layer includes at least one of titanium (Ti) and copper (Cu).

15. The semiconductor package of claim 12, wherein at least a portion of a side surface of the plating layer of the UBM layer is spaced apart from the insulating layer of the connection member.

16. The semiconductor package of claim 12, wherein the insulating layer of the connection member includes a region coplanar with a lower surface of the plating layer of the UBM layer at a circumference of the plating layer of the UBM layer.

17. The semiconductor package of claim 12, wherein the insulating layer of the connection member is made of an organic material.

* * * * *